United States Patent

Zhang et al.

(10) Patent No.: US 9,454,034 B2
(45) Date of Patent: Sep. 27, 2016

(54) COLOR FILTER ARRAY SUBSTRATE, METHOD FOR FABRICATING THE SAME AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Hongshu Zhang, Beijing (CN); Xibin Shao, Beijing (CN); Yuqiong Chen, Beijing (CN); Yan Li, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 18 days.

(21) Appl. No.: 14/348,220

(22) PCT Filed: Nov. 19, 2013

(86) PCT No.: PCT/CN2013/087388
§ 371 (c)(1),
(2) Date: Mar. 28, 2014

(87) PCT Pub. No.: WO2014/187090
PCT Pub. Date: Nov. 27, 2014

(65) Prior Publication Data
US 2015/0248038 A1 Sep. 3, 2015

(30) Foreign Application Priority Data
May 23, 2013 (CN) .......................... 2013 1 0195220

(51) Int. Cl.
*H01L 21/70* (2006.01)
*G02F 1/1335* (2006.01)
(Continued)

(52) U.S. Cl.
CPC ....... *G02F 1/133516* (2013.01); *G02F 1/1368* (2013.01); *G02F 1/133514* (2013.01);
(Continued)

(58) Field of Classification Search
CPC .................. G01F 1/133514; G01F 1/133512; G03F 7/0007; H01L 27/14621
See application file for complete search history.

(56) References Cited

U.S. PATENT DOCUMENTS

| | | | | |
|---|---|---|---|---|
| 6,104,459 A * | 8/2000 | Oike et al. | ..................... | 349/105 |
| 2008/0303993 A1* | 12/2008 | Kuo et al. | ..................... | 349/114 |
| 2011/0019139 A1* | 1/2011 | Cui | ................... | G02F 1/133516 |
| | | | | 349/138 |

FOREIGN PATENT DOCUMENTS

| CN | 101256302 A | 9/2008 |
|---|---|---|
| CN | 101349842 A | 1/2009 |

(Continued)

OTHER PUBLICATIONS

International Search Report mailed Jun. 3, 2014; PCT/CN2013/087388.

(Continued)

*Primary Examiner* — Shaun Campbell
(74) *Attorney, Agent, or Firm* — Ladas & Parry LLP

(57) ABSTRACT

A color filter array substrate, a method for fabricating the same and a display device are disclosed. The color filter array substrate includes a plurality of gate lines and a plurality of data lines disposed as intersecting each other horizontally and vertically and a plurality of pixel regions defined by the gate lines and the data lines, each of the pixel regions includes a TFT, wherein each of the pixel regions further includes a band-pass filter layer, the band-pass filter layer transmits light within a specific wavelength range while reflects light of other wavelengths; the band-pass filter layer comprises a first medium sub-layer, a second medium sub-layer and a third medium sub-layer, the second medium layer is of different thicknesses at different pixel regions.

6 Claims, 4 Drawing Sheets

(51) Int. Cl.
　　　*G02F 1/1368*　　(2006.01)
　　　*H01L 27/12*　　(2006.01)
　　　*G02F 1/1362*　　(2006.01)

(52) U.S. Cl.
　　　CPC ....... *G02F1/136286* (2013.01); *H01L 27/124* (2013.01); *H01L 27/1248* (2013.01); *H01L 27/1262* (2013.01); *G02F 2001/133521* (2013.01); *G02F 2001/136222* (2013.01); *G02F 2203/02* (2013.01)

(56) References Cited

FOREIGN PATENT DOCUMENTS

| CN | 101614906 A | 12/2009 |
|---|---|---|
| CN | 103278963 A | 9/2013 |

OTHER PUBLICATIONS

First Chinese Office Action Appln. No. 201310195220.X; Dated Mar. 17, 2015.

Second Chinese Office Action Appln. No. 201310195220.X; Dated Aug. 18, 2015.

Third Chinese Office Action dated Nov. 10, 2015; Appln. No. 201310195220.X.

International Preliminary Report on Patentability issued Nov. 24, 2015; PCT/CN2013/087388.

\* cited by examiner

COLOR FILTER ARRAY SUBSTRATE, METHOD FOR FABRICATING THE SAME AND DISPLAY DEVICE

FIELD OF THE ART

Embodiments of the invention relate to the field of display technologies, more particularly, to a color filter array substrate, a method for fabricating the same and a display device.

BACKGROUND

A Thin Film Transistor Liquid Crystal Display (TFT-LCD) comprises a TFT array substrate, a color filter and a liquid crystal layer, among which the color filter is the key component of the LCD and configured to display colorful images. In earlier technologies for fabricating a TFT-LCD, the color filter and the TFT which functions as a driving switch are formed on different substrates and disposed on either side of the liquid crystal layer. However, such a configuration will render the aperture ratio of the display panel low, which will further compromise the brightness and picture quality of the display panel. Recently, in response to the increasing requirement on the aperture ratio and the brightness of the available display panels, the industry has developed a technology which forms the color filter directly on the array substrate (Color filter on Array, COA). That is, the color filter and the TFT are formed on the same and one glass substrate, which can not only increase the aperture ratio of the display panel but also improve the brightness of the display panel; meanwhile, issues associating with forming the color filter and the TFT on different substrates are avoided.

With a TFT-LCD fabricated by using the conventional COA technology, the array substrate of the liquid crystal panel comprises gate lines and data lines arranged as intersecting each other horizontally and vertically, and a plurality of pixel regions defined by the gate lines and the data lines; a TFT and a color filter layer of different colors, normally a red color filter layer (R), a green color filter layer (G) and a blue color filter layer (B), are formed in the pixel regions. The color filter layer is a typically color-blocking type color filter layer, which filters colors by absorbing lights, causing the light usage to be as low as approximately 30%.

SUMMARY

Embodiments of the invention provide a color filter array substrate, a method for fabricating the same and a display device to solve the problem of having low light usage by the color filter layer of the color filter array substrate.

A first aspect of the invention provides color filter array substrate, comprising a plurality of gate lines and a plurality of data lines disposed as intersecting each other horizontally and vertically and a plurality of pixel regions defined by the gate lines and the data lines, each of the pixel regions comprises a TFT, wherein each of the pixel regions further comprises a band-pass filter layer, the band-pass filter layer transmits light within a specific wavelength range while reflects light of other wavelengths;

the band-pass filter layer comprises a first medium sub-layer, a second medium sub-layer and a third medium sub-layer, the second medium layer is of different thicknesses at different pixel regions.

Another aspect of the invention provides a display device comprising the above color filter array substrate.

Still another aspect of the invention further provides a method for fabricating a color filter array substrate, comprising following a TFT above a base substrate and forming a band-pass filter layer comprising a first medium sub-layer, a second medium sub-layer and a third medium sub-layer above the base substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

NUMERAL REFERENCES

Figure 1:
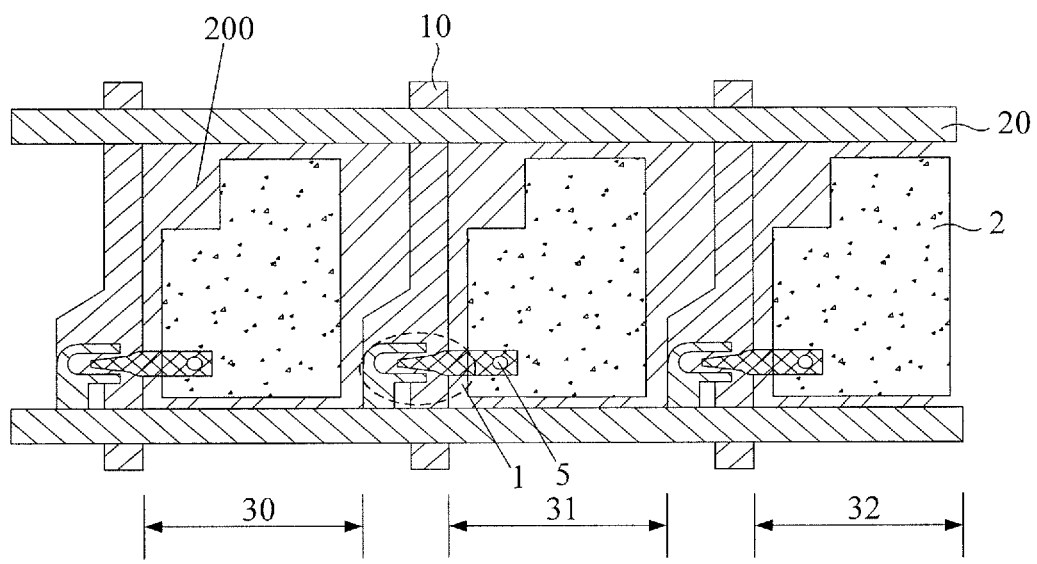
FIG. 1 schematically illustrates a plan view of a color filter array substrate in accordance with an embodiment of the invention.

1—TFT; 2—pixel electrode; 3—source electrode of the TFT; 4—drain electrode of the TFT; 5—via hole in a passivation layer; 6—PECVD equipment; 7—mask plate; 8—gate electrode of the TFT; 10—gate line; 20—data line; 30—first pixel region; 31—second pixel region; 32—third pixel region; 40—active layer; 50—source/drain metal layer; 100—base substrate; 101—gate insulation layer; 102—passivation layer; 103—insulation layer; 200—band-pass filter layer; 201—first medium sub-layer; 202—second medium sub-layer; 203—third medium sub-layer.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at lease one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

A display panel of a LCD fabricated by using the COA technology has improved aperture ratio and brightness. However, a color filter layer of the LCD fabricated by using the conventional COA technology is typically a color-blocking (absorbing) type color filter layer, which filters colors by absorbing lights, thus making the light usage low. In view of the technical problem, embodiments of the invention provide a color filter array substrate, a method for fabricating the same and a display device for the purpose of improving light usage.

A band-pass color filter layer may separate monochromic light within a certain wavelength range from compound light. When light within a wavelength range incidents onto the band-pass filter layer, only the light within a small section of the wavelength range has a high transmissivity, while the light within other wavelength range has a high reflectivity. Generally, a band-pass filter layer has two configurations, one of which has a pass band consisting of a long-wavelength pass layer and a short-wavelength pass layer with the two pass layers having an overlapping wavelength range of the pass band. But, with such a configuration, it is difficult to obtain a narrow pass band, so it is unsuitable for using in a color filter of the LCD. The other is a filter layer in the form of a Fabry-Pérot interferometer, which comprises a second medium sub-layer, on two opposite surfaces of which a first medium sub-layer and a third medium sub-layer are coated, wherein the transmissivity of light is associated with the thickness of the second medium sub-layer; that is, light of different wavelengths corresponds to different thicknesses of the second medium sub-layer. With such a configuration, a narrower pass band can be obtained, so it is suitable for using in a color filter of the LCD. In the following embodiments of the invention, the color filter layer of the color filter array substrate is a Fabry-Perot interferometer filter layer.

In the following embodiments, "band-pass filter layer being disposed above the TFT" means the band-pass filter layer is disposed above the gate insulation layer of the TFT; "band-pass filter layer being disposed under the TFT" means the band-pass filter layer is disposed under the gate electrode of the TFT.

Embodiment 1

Figure 2:
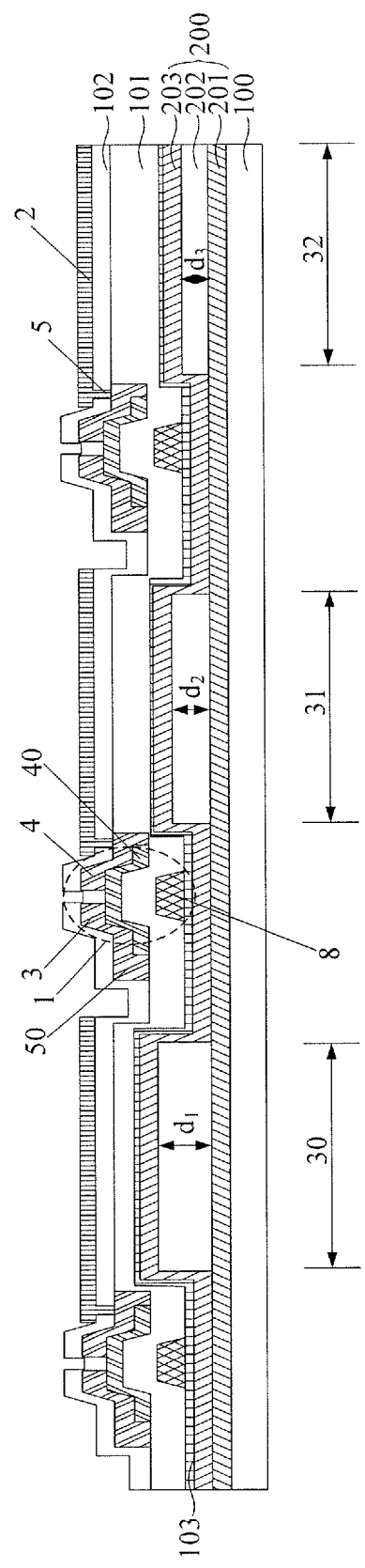
FIG. 2 schematically illustrates a configuration of a color filter array substrate in accordance with an embodiment of the invention.

Referring to FIGS. 1 and 2, a color filter array substrate of the embodiment comprises a plurality of gate lines 10 and a plurality of data lines 20 disposed as intersecting each other horizontally and vertically and a plurality of pixel regions 30, 31, 32 defined by the gate lines 10 and the data lines 20, a TFT 1 and a color filter layer 200 are formed in each of the pixel regions, the color filter layer 200 allows only light within a specific wavelength range to transmit so as to display colorful images, while reflects light of other wavelengths for reusing, thereby improving the light usage.

In the embodiment, the color filter layer 200 is for example a band-pass filter layer, which comprises a first medium sub-layer 201, a second medium sub-layer 202 and a third medium sub-layer 203 sequentially fainted on a base substrate 100. After light emitted by the backlight of the LCD is incident on the first medium sub-layer 201, a part of light is reflected back, and then reflected by the reflection plate of the backlight source of the LCD for reuse, which improves the light usage of the light; while other part of light is incident on the second medium sub-layer 202. By controlling the thickness of the second medium sub-layer 202 at different pixel regions, it allows only light within a small certain section of the wavelength range to get transmitted through the third medium sub-layer 203 in each pixel region. That is to say, the pass band is configured to be quite narrow, which can guarantee the color resolution and quality of the LCD; while the light in other wavelength range is reflected back in the same way and then reflected by the reflection plate of the backlight of the LCD for reuse, which helps to further improve the light usage of the backlight. The light usage by the band-pass filter layer in the color filter array substrate of the embodiment can be up to approximately 50%.

The LCD generally displays color images with three primary colors of red, green and blue. Accordingly, the plurality of pixel regions of the color filter array substrate of the embodiment are divided into a first pixel region 30, a second pixel region 31 and a third pixel region 32 according to the thickness of the second medium sub-layer 202. For example, the second medium sub-layer 202 at the first pixel region 30 has a first thickness $d_1$, and transmits only red light while reflects light of other wavelengths; the second medium sub-layer 202 at the second pixel region 31 has a second thickness $d_2$, and transmits only green light while reflects light of other wavelengths; the second medium sub-layer 202 in the third pixel region 32 has a third thickness $d_3$, and transmits only blue light while reflects light of other wavelengths.

As an example, the thickness d of the second medium sub-layer 202 at each pixel region may be calculated based on the equation $$d = \frac{m*\lambda}{2n},$$

where m is an odd number, preferably m=1; the smaller the calculated thickness d of the second medium sub-layer 202 is, the better the light transmittance is; $\lambda$ is the wavelength of light to be transmitted in each pixel region, n is the refractive index of the second medium sub-layer 202. As an example, $d_1 > d_2 > d_3$.

As an example, the thickness of the first medium sub-layer 201 and the third medium sub-layer 203 may be configured as being equal to each other $D_{201} = D_{203}$, thereby ensuring the symmetry and single wave peak of the light transmittance spectra of the band-pass filter layer 200.

As an example, for the purpose of ensuring the light transmittance, the first medium sub-layer 201 may be configured as having a smaller thickness, typically from 20 nm to 100 nm, preferably 40 nm, and the third medium sub-layer 203 may be configured as having a smaller thickness, typically from 20 nm to 100 nm, preferably 40 nm.

In the embodiment, materials of the first medium sub-layer 201 and the third medium sub-layer 203 may be, but not limited to, metal, alloy or metal oxide, such as a silver, silver alloy, indium tin oxide (ITO) or indium zinc oxide. Preferably, the first medium sub-layer 201 and the third medium sub-layer 203 are made of the same material, so as to further ensure the symmetry and single wave peak of the light transmittance spectra of the band-pass filter layer 200.

The band-pass filter layer 200 may be formed on the base substrate 100 through a separate process, or formed at the same time as the TFT 1 through the same fabrication process.

Referring to FIG. 2, when the band-pass filter layer 200 is formed on the base substrate 100 through a separate process, the band-pass filter layer 200 is preferably disposed under the pixel electrode 2, so as to prevent the band-pass filter layer 200 from affecting an electric field driving liquid crystal molecules to rotate, this is due to that the electric field driving the liquid crystal molecules to rotate for a TN-LCD is formed between the pixel electrode on the array substrate and the common electrode on the opposed substrate. By contrast, the electric field driving the liquid crystal molecules to rotate for an ADS-LCD is formed by the pixel electrode and the common electrode on the array substrate, thus, the third medium sub-layer 203 in FIG. 2 may also function as the common electrode, thereby saving the step of forming the common electrode separately. When the third medium sub-layer 203 is used as the common electrode, the third medium sub-layer 203 may be made of a transparent conductive material such as ITO. When the first medium sub-layer 201 and the third medium sub-layer 203 are made of the same material, the second medium sub-layer 202 may be made of a dielectric material, such as $MgF_2$, $SiO_2$, $Si_3N_4$ or $TiO_2$.

In the embodiment, when the third medium sub-layer 203 is made of a conductive material, an insulation layer 103 may be formed between the band-pass filter layer 200 and the TFT 1 as illustrated in FIG. 2.

The TFT 1 of the embodiment of the invention is a bottom-gate TFT, that is, the gate electrode 8 of the TFT is located under the source electrode 3 and the drain electrode 4. A fabrication process of such a TFT comprises for example: first forming the gate electrode 8 of the TFT on the base substrate 100; then sequentially forming the gate insulation layer 101, a pattern of an active layer 40 and a pattern of a source/drain metal layer 50 on the base substrate 100, wherein the pattern of the source/drain metal layer 50 comprises the source electrode 3 and the drain electrode 4; finally forming a passivation layer 102 having a via hole 5 above the TFT 1. The gate electrode 8 of the TFT 1 is connected to the gate line 10, the source electrode 3 connected to the data line 20, and the drain electrode 4 connected to the pixel electrode 2 by way of the via hole 5 in the passivation layer 102.

It can be readily conceived by a person of ordinary skill in the art that the TFT can be not only a bottom-gate TFT but also a top-gate TFT, a coplanar TFT, a back-channel TFT, and fabrication processes for the corresponding band-pass filter layer 200 is the same as the above method and will not be elaborated here.

Embodiment 2

Figure 8:
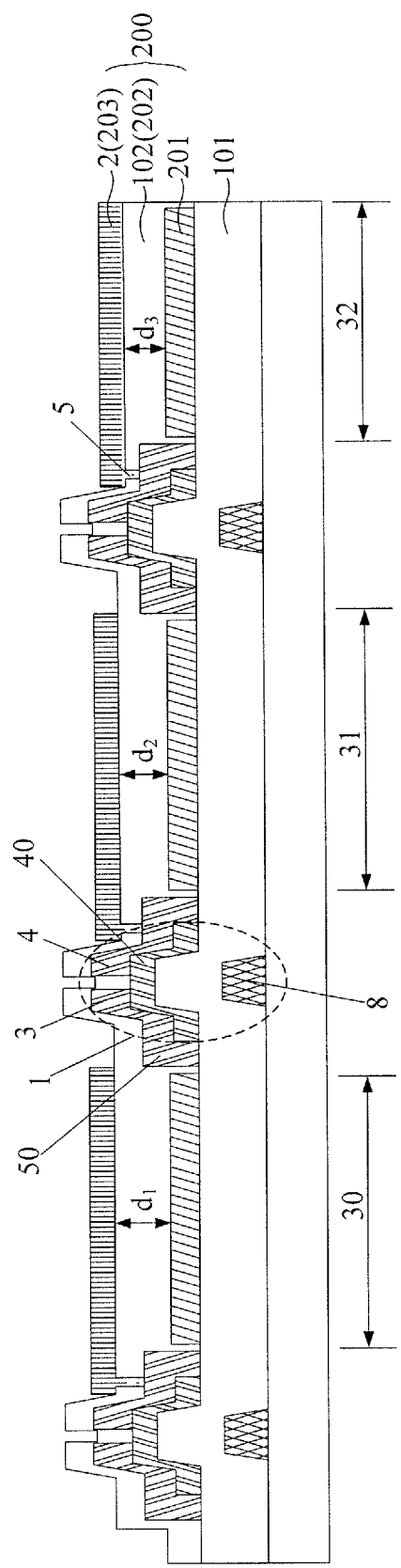
FIG. 8 schematically illustrates another configuration of a color filter array substrate in accordance with an embodiment of the invention.

The color filter array substrate provided by the embodiment is illustrated in FIG. 8. It differs from Embodiment 1 in that the band-pass filter layer 200 of the embodiment is formed above the TFT and formed at the same time as the TFT 1 by using the same fabrication process.

In the embodiment, the first medium sub-layer 201 is formed on the gate insulation layer 101. The passivation layer 102 may function as both the insulation layer between the band-pass filter layer 200 and TFT 1 and the second medium sub-layer 202, while the pixel electrode 2 may function as the third medium sub-layer 203. As a result, steps for forming the respective second and third medium sub-layers 202 and 203 are saved. In this case, the pixel electrode 2 (the third medium sub-layer 203) may still be electrically connected to the drain electrode 4 of the TFT 1 by way of the via hole 5 in the passivation layer 102.

In the embodiment, the third medium sub-layer 203 overlays the first, second and third pixel regions 30, 31 and 32. The third medium sub-layer 203 may be made of a transparent conductive material such as ITO. When the first medium sub-layer 201 and the third medium sub-layer 203 are made of the same material, the second medium sub-layer 202 may be made of a dielectric material, such as $MgF_2$, $SiO_2$, $Si_3N_4$ or $TiO_2$.

In the embodiment, the passivation layer 102 may be configured as having different thicknesses at different pixel regions, such that the passivation layer 102 functioning as the second medium sub-layer 202 has different light-transmittable wavelength ranges for different pixel regions. It can be contemplated that in other embodiments it may also configure the gate insulation layer 101 as having different thicknesses at different pixel regions such that the gate insulation layer 101 may function as the second medium sub-layer 202 of the band-pass filter layer 200. Whether it is the passivation layer 102 or the gate insulation layer 101 that functions as the second medium sub-layer 202, the processes for separately fabricating the second medium sub-layer 202 and its material can be saved.

Embodiment 3

The embodiment provides a method for fabricating the color filter array substrate of Embodiment 1, the method comprises: forming a TFT above a base substrate, and forming a band-pass filter layer above the base substrate, wherein the band-pass filter layer is formed under the TFT (that is, between the TFT and the base substrate). Thus the band-pass filter layer is formed through a separate process.

For example, as illustrated in FIG. 2 and FIGS. 3 to 7, the method comprises:

Step 1: forming a first medium sub-layer on a base substrate.

Figure 3:
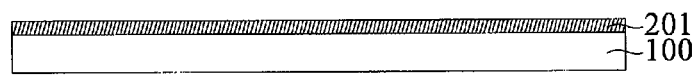
FIGS. 3 to 7 schematically illustrate a procedure for fabricating a band-pass filter layer on a color filter array substrate provided by an embodiment of the invention.

In connection with FIG. 3, as light allowed to be transmitted through the band-pass filter layer 200 is only related to the thickness of the second medium sub-layer 202, the first medium sub-layer 201 covering the whole base substrate 100 may be formed on the base substrate 100 by way of coating, deposition, sputtering and similar processes. As no patterning process is required, the production efficiency is improved and the production cost reduced.

Step 2: forming a second medium sub-layer on the base substrate having the first medium sub-layer formed thereon, the second medium sub-layer is of different thicknesses at different pixel regions.

Figure 4:
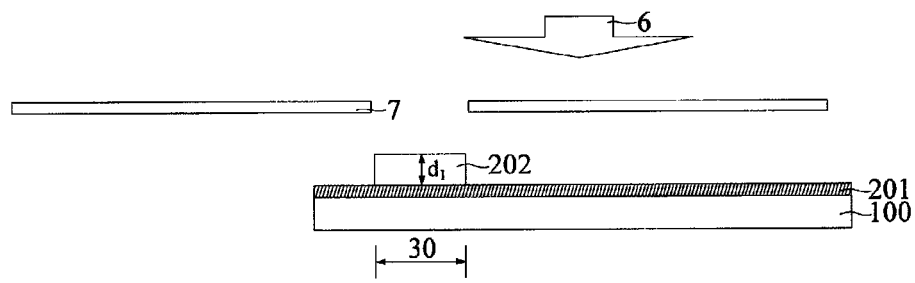
Figure 5:
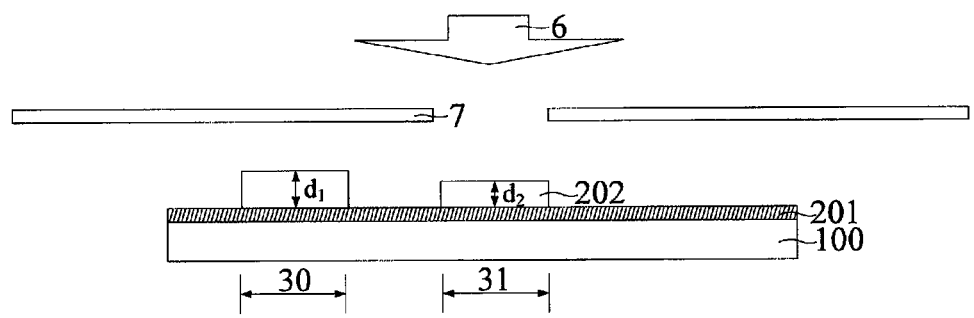
Figure 6:
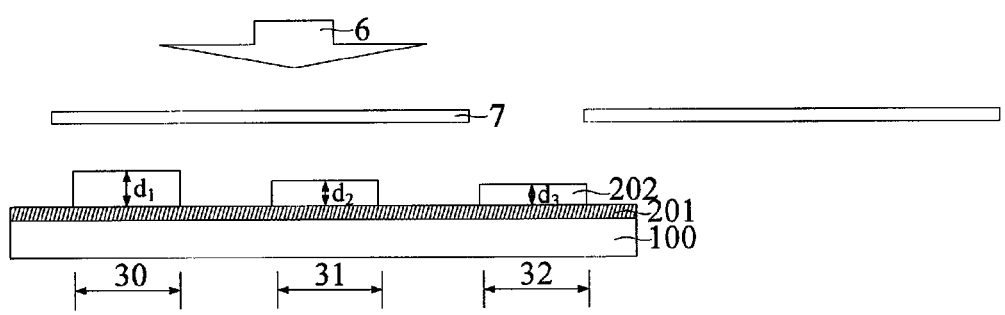

In connection with FIGS. 4 to 6, the step 2 may comprise for example:

First, the second medium sub-layer 202 covering the first pixel region 30 is deposited on the base substrate 100 by using a mask 7 through for example a Plasma Enhanced Chemical Vapor Deposition (PECVD) equipment 6; at the same time, the deposition time is controlled such that the thickness of the second medium sub-layer 202 at the first pixel region 30 is $d_1$. As an example, when the second medium sub-layer 202 is $Si_3N_4$, assuming m=1, n=1.938, λ=700 nm, it is calculated from $$d = \frac{m*\lambda}{2n}$$

that $d_1$=180.6 nm, wherein a value range of $d_1$ is 180.6±15.5 nm.

Thereafter, the mask 7 is moved rightward to a position above a region to have the second medium sub-layer 202 to be formed therein. The second medium sub-layer 202 covering the second pixel region 31 is deposited on the base substrate 100 through the PECVD equipment 6; at the same time the deposition time is controlled such that the thickness of the second medium sub-layer 202 at the second pixel region 31 is $d_2$. As an example, when the second medium sub-layer 202 is $Si_3N_4$, assuming m=1, n=1.938, λ=546.1 nm, it is calculated from $$d = \frac{m * \lambda}{2n}$$

that $d_2$=140.9 nm, wherein a value range of $d_2$ is 140.9±15.5 nm.

Finally, the mask 7 is moved rightward to a position above a region to have the second medium sub-layer 202 to be formed therein. The medium sub-layer 202 covering the third pixel region 32 is deposited on the base substrate 100 through the PECVD equipment 6; at the same time the deposition time is controlled such that the thickness of the second medium sub-layer 202 at the third pixel region 32 is $d_3$. As an example, when the second medium sub-layer 202 is $Si_3N_4$, assuming m=1, n=1.938, λ=435.8 nm, it is calculated from $$d = \frac{m * \lambda}{2n}$$

that $d_3$=112.4 nm, wherein a value range of $d_3$ is 112.4±15.5 nm.

It is noted that the steps for forming the second medium sub-layer 202 having the first thickness $d_1$, the second medium sub-layer 202 having the second thickness $d_2$ and the second medium sub-layer 202 having the third thickness $d_3$ are interchangeable in sequence, which is also within the scope of the invention.

Furthermore, the second medium sub-layer 202 may also be formed with other fabrication processes, such as multi-grayscale mask process, which is also within the scope of the invention.

Step 3: forming a third medium sub-layer on the base substrate having the first medium sub-layer and the second medium sub-layer formed thereon.

Figure 7:
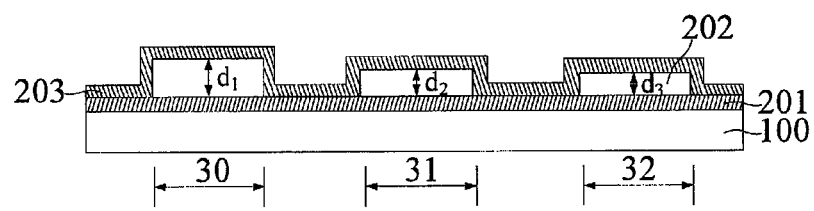

In connection with FIG. 7, the third medium sub-layer 203 may be formed on the first medium sub-layer 201 and the second medium sub-layer 202 by way of coating, deposition, sputtering and the like.

Step 4: fabricating a TFT on the third medium sub-layer.

For example, the TFT 1 is formed on the third medium sub-layer 203 by using a conventional method in the art.

For an ADS-LCD, the third medium sub-layer 203 may be made of a transparent conductive material, such that it can function as the common electrode, thereby saving the process for fabricating the common electrode. An insulation layer 103 may also be formed between the band-pass filter layer 200 and the TFT 1, as illustrated in FIG. 2.

Embodiment 4

The embodiment provides a method for fabricating the color filter array substrate of Embodiment 2, the method comprises: forming a TFT above a base substrate, and forming a band-pass filter layer above the base substrate, wherein band-pass filter layer is formed above the TFT (that is, above the gate insulation layer of the TFT). Thus the band-pass filter layer is formed at the same time as the TFT with the same fabrication process.

As illustrated in FIG. 8, the method comprises for example:

Step 1: forming a TFT 1 on a base substrate 100.

Step 2: forming a first medium sub-layer 201 on a gate insulation layer 101 of the TFT 1.

For example, the first medium sub-layer 201 covering the entire base substrate 100 may be faulted on the gate insulation layer 101 by way of coating, deposition, sputtering and similar processes, then a pattern of the first medium sub-layer is formed for example through a patterning process, such that the first medium sub-layer 201 covers only the first, second and third pixel regions 30, 31 and 32.

Step 3: forming a passivation layer 102 above the TFT 1, a via hole 5 is formed in the passivation layer 102 above the drain electrode 4 of the TFT 1, the passivation layer 102 is of different thicknesses $d_1$, $d_2$, $d_3$ at respectively different pixel regions 30, 31, 32 and functions as a second medium sub-layer 202 of the band-pass filter layer 200.

Step 4: forming the pixel electrode 2 above the passivation layer 102, the pixel electrode 2 is electrically connected to the drain electrode 4 of the TFT 1 by way of the via hole 5 in the passivation layer, the pixel electrode 2 functions as a third medium sub-layer 203 of the band-pass filter layer 200.

As an example, for a TN-LCD, the second medium sub-layer 202 is preferably formed in the same layer as the passivation layer 102 to save processes. Moreover, the third medium sub-layer 203 is configured as a conductive material and electrically connected to the drain electrode 4 of the TFT 1 by way of the via hole 5 in the passivation layer and covers only the first pixel region 30, the second pixel region 31 and the third pixel region 32, making it possible to use the third medium sub-layer 203 as the pixel electrode 2.

In other examples, the gate insulation layer 101 may be configured as having different thicknesses at different pixel regions; therefore the gate insulation layer 101 may be used as the second medium sub-layer 202 of the band-pass filter layer 200. In this case, the above steps 1, 2 and 3 may be replaced by the followings step:

forming the TFT 1 on the base substrate 100, wherein the gate insulation layer 101 of the TFT 1 has different thicknesses at different pixel regions and functions as the second medium sub-layer 202 of the band-pass filter layer 200;

forming the passivation layer above the TFT, the via hole is formed in the passivation layer above the drain electrode of the TFT.

In summary, when forming the band-pass filter layer 200 at the same time as the TFT 1 with the same fabrication process, the passivation layer 102 may be configured as having different thicknesses at different pixel regions, thereby the passivation layer 102 may be used as the second medium sub-layer 202 of the band-pass filter layer 200. It can be contemplated that the gate insulation layer 101 may also be configured as having different thicknesses at different pixel regions; thereby the gate insulation layer 101 may be used as the second medium sub-layer 202 of the band-pass filter layer 200. Whether it is the passivation layer 102 or the gate insulation layer 101 that functions as the second medium sub-layer 202 of the band-pass filter layer 200, the process for separately fabricating the second medium sub-layer 202 and its material can be saved.

Embodiment 5

The embodiment provides a display device, which comprises the color filter array substrate of any of the foregoing embodiments. It can thus significantly improve the light usage of the display device and guarantee the color resolution and display quality of the display device.

The display device may be for example a LCD panel, an E-paper, an OLED panel, a mobile phone, a tablet PC, a television, a display monitor, a notebook, a digital photoframe, a navigator and any product or component having a display function.

In all the embodiments of the invention, with respect to a LCD which does not display colorful images with only three primary colors of RGB, such as having a white (W) sub-pixel or a yellow (Y) sub-pixel in addition to the three primary colors of RGB, it only needs to add one more pixel region with a second medium sub-layer having a fourth thickness of $d_4$, which allows only white (or yellow) light to be transmitted while reflecting light of other wavelengths. As for other LCDs that display colorful images using other color-mixing schemes, it is only necessary to modify the thickness of the second medium sub-layer in each pixel regions, thereby allowing light of a specific wavelength to be transmitted while reflecting light of other wavelengths.

It is seen from the above embodiments that the color filter array substrate and its fabrication method as well as the display device provided by the embodiments of the invention filters light by using the Fabry-Pérot band-pass filter layer, while un-transmitted light are reflected back and reused, which significantly improves the light usage, thereby further improving the light usage of the LCD. Moreover, the pass band of the color filter is quite narrow, which guarantees the color resolution and quality of the LCD. Moreover, as the band-pass filter layer is integrated on the array substrate, it helps to improve the aperture ratio of the display device, increasing the brightness of the display device.

What are described above is related to the illustrative embodiments of the disclosure only and not limitative to the scope of the disclosure; the scopes of the disclosure are defined by the accompanying claims.

What is claimed is:

1. A display device comprising a color filter array substrate, the color filter array substrate comprising a plurality of gate lines and a plurality of data lines disposed as intersecting each other horizontally and vertically and a plurality of pixel regions defined by the gate lines and the data lines, each of the pixel regions comprising a thin film transistor (TFT), wherein each of the pixel regions further comprises a band-pass filter layer, the band-pass filter layer transmits light within a specific wavelength range while reflects light of other wavelengths;

the band-pass filter layer consists of a first medium sub-layer, a second medium sub-layer and a third medium sub-layer, the second medium layer is of different thicknesses at different pixel regions, wherein the band-pass filter layer is disposed under the TFT;

an insulation layer is formed between the band-pass filter layer and the TFT, the third medium sub-layer is made of a transparent conductive material and is configured to function as a common electrode.

2. The display device of claim 1, wherein the plurality of pixel regions are divided into a first pixel region, a second pixel region and a third pixel region according to the different thickness of the second medium sub-layer; the second medium sub-layer has a first thickness at the first pixel region, the band-pass filter layer in the first pixel region transmits red light and reflects light of other wavelengths; the second medium sub-layer has a second thickness at the second pixel region, the band-pass filter layer in the second pixel region transmits green light and reflects light of other wavelengths; the third medium sub-layer has a third thickness at the third pixel region, the band-pass filter layer in the third pixel region transmits blue light and reflects light of other wavelengths.

3. The display device of claim 1, wherein the first medium sub-layer and the third medium sub-layer are made of a metal material, an alloy material or a metal oxide material, the second medium sub-layer is made of a dielectric material.

4. The display device of claim 1, wherein the first medium sub-layer and the third medium sub-layer are made of a same material and of a same thickness.

5. The display device of claim 1, wherein the first medium sub-layer has a thickness ranged from 20 nm to 100 nm and the third medium sub-layer has a thickness ranged from 20 nm to 100 nm.

6. A method for fabricating the display device of claim 1.

\* \* \* \* \*